(12) United States Patent
Lai et al.

(10) Patent No.: US 9,190,441 B2
(45) Date of Patent: Nov. 17, 2015

(54) IMAGE SENSOR TRENCH ISOLATION WITH CONFORMAL DOPING

(71) Applicant: Taiwan Semiconductor Manufacturing Company, Ltd., Hsin-Chu (TW)

(72) Inventors: Chih-Yu Lai, Tainan (TW); Yeur-Luen Tu, Taichung (TW); Chih-Hui Huang, Tainan County (TW); Cheng-Ta Wu, Chiayi County (TW); Chia-Shiung Tsai, Hsinchu (TW); Luan C. Tran, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/507,895

(22) Filed: Oct. 7, 2014

(65) Prior Publication Data

US 2015/0056739 A1 Feb. 26, 2015

Related U.S. Application Data

(62) Division of application No. 13/290,733, filed on Nov. 7, 2011, now Pat. No. 8,853,811.

(51) Int. Cl.
| | |
|---|---|
| H01L 27/146 | (2006.01) |
| H01L 21/223 | (2006.01) |
| H01L 21/225 | (2006.01) |
| H01L 21/02 | (2006.01) |
| H01L 21/762 | (2006.01) |
| H01L 31/09 | (2006.01) |

(52) U.S. Cl.
CPC ...... *H01L 27/1463* (2013.01); *H01L 21/02129* (2013.01); *H01L 21/223* (2013.01); *H01L 21/2255* (2013.01); *H01L 21/76224* (2013.01); *H01L 27/1464* (2013.01); *H01L 27/14621* (2013.01); *H01L 27/14627* (2013.01); *H01L 27/14636* (2013.01); *H01L 27/14685* (2013.01); *H01L 31/09* (2013.01)

(58) Field of Classification Search
USPC ......................................................... 257/446
See application file for complete search history.

(56) References Cited

U.S. PATENT DOCUMENTS

| | | | |
|---|---|---|---|
| 7,875,918 B2 | 1/2011 | Venezia et al. | |
| 8,674,469 B2 | 3/2014 | Huang et al. | |
| 2005/0184353 A1* | 8/2005 | Mouli | 257/446 |
| 2009/0278181 A1* | 11/2009 | Tanaka et al. | 257/292 |
| 2009/0315137 A1* | 12/2009 | Kwon et al. | 257/446 |
| 2010/0133592 A1* | 6/2010 | Mori et al. | 257/255 |
| 2010/0270636 A1* | 10/2010 | Huang et al. | 257/432 |
| 2013/0113061 A1 | 5/2013 | Lai et al. | |

* cited by examiner

*Primary Examiner* — Stephen W Smoot
(74) *Attorney, Agent, or Firm* — Haynes and Boone, LLP

(57) ABSTRACT

Provided is a semiconductor image sensor device. The image sensor device includes a substrate. The image sensor device includes a first pixel and a second pixel disposed in the substrate. The first and second pixels are neighboring pixels. The image sensor device includes an isolation structure disposed in the substrate and between the first and second pixels. The image sensor device includes a doped isolation device disposed in the substrate and between the first and second pixels. The doped isolation device surrounds the isolation structure in a conformal manner.

20 Claims, 9 Drawing Sheets

IMAGE SENSOR TRENCH ISOLATION WITH CONFORMAL DOPING

PRIORITY DATA

The present application is a divisional application of U.S. patent application Ser. No. 13/290,733, filed Nov. 7, 2011, issued as U.S. Pat. No. 8,853,811, which is incorporated herein by reference in its entirety.

BACKGROUND

Semiconductor image sensors are used to sense radiation such as light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors, that can absorb radiation projected toward the substrate and convert the sensed radiation into electrical signals.

In recent years, the semiconductor integrated circuit (IC) industry has experienced rapid growth. Technological advances in IC materials and design have produced generations of ICs where each generation has smaller and more complex circuits than the previous generation. As a part of the IC evolution for semiconductor image sensors, the size of the radiation-sensitive pixels has been steadily reduced. As the pixels and the separation between adjacent pixels continue to shrink, issues such as excessive dark current and cross-talk become more difficult to control. Conventional methods of addressing the dark current and cross-talk issues have been expensive and require complex implementation. Even then, the image sensors fabricated using conventional methods may still have poor dark current and cross-talk performance.

Therefore, while existing semiconductor image sensors have been generally adequate for their intended purposes, they have not been entirely satisfactory in every aspect.

BRIEF DESCRIPTION OF THE DRAWINGS

Aspects of the present disclosure are understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
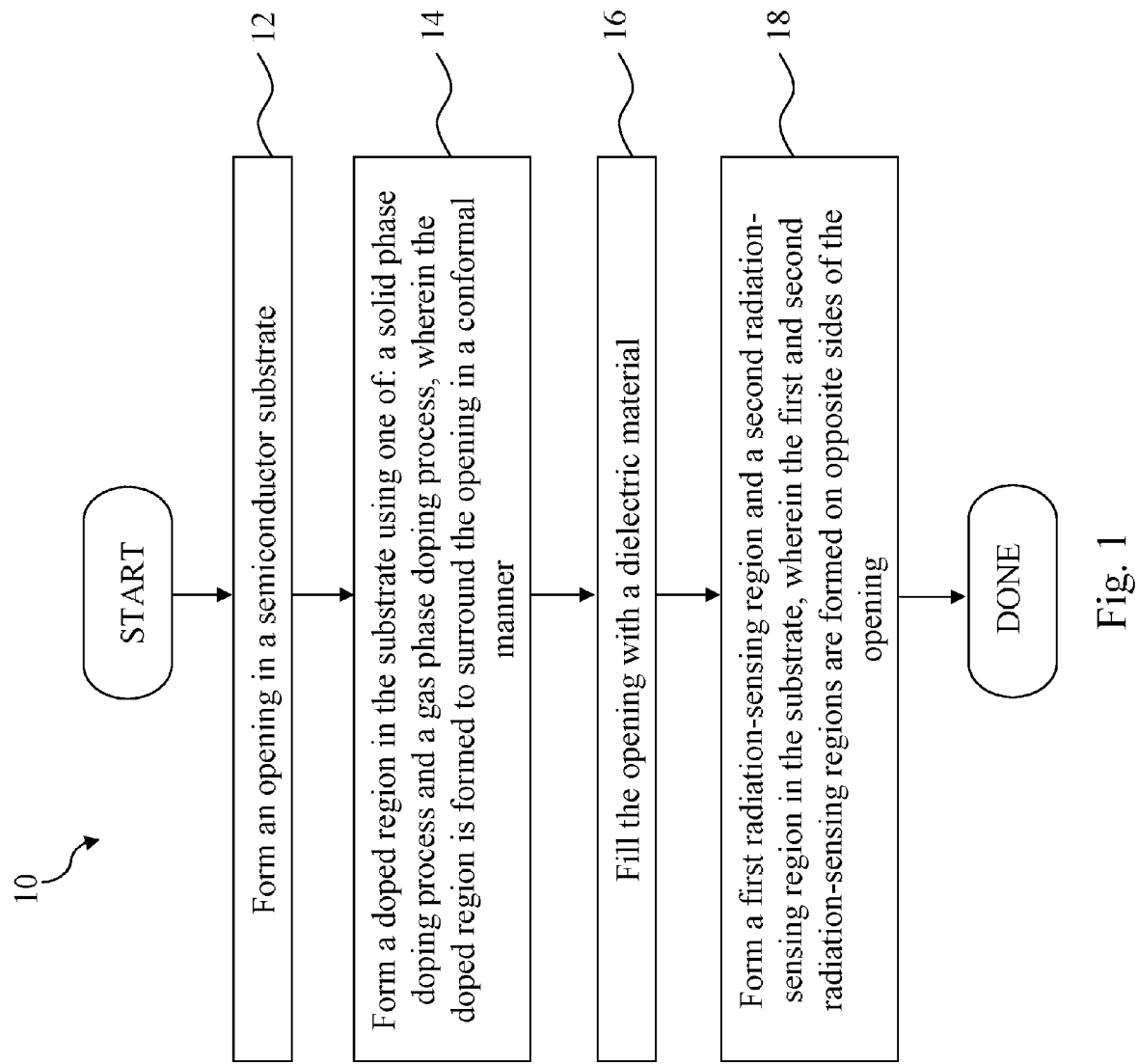
FIG. 1 is a flowchart illustrating a method for fabricating an image sensor device according to various aspects of the present disclosure.

Illustrated in FIG. 1 is a flowchart of a method 10 for fabricating a semiconductor image sensor device according to various aspects of the present disclosure. Referring to FIG. 1, the method 10 begins with block 12 in which an opening is formed in a semiconductor substrate. The method 10 continues with block 14 in which a doped region is formed in the substrate using one of: a solid phase doping process and a gas phase doping process instead of traditional implantation method. In some embodiments, the solid phase doping process and the gas phase doping process are each carried out using a dopant diffusion process. The doped region is formed to surround the opening in a conformal manner. In some embodiments, the solid phase doping process is performed using a Boron-Silicate Glass (BSG) material with a thermal treatment process, and the gas phase doping process is performed using a Triethylborane (TEB) gas. In some embodiments, the doped region is formed without ion implantation processes.

The method 10 continues with block 16 in which the opening is filled with a dielectric material. In some embodiments, a deep trench isolation device is formed by the dielectric material filling the opening. The method 10 continues with block 18 in which a first radiation-sensing region and a second radiation-sensing region are formed in the substrate. The first and second radiation-sensing regions are formed on opposite sides of the opening. In some embodiments, the first and second radiation-sensing regions each have a first doping polarity, and the doped region has a second doping polarity different from the first doping polarity. In some embodiments, the image sensor device is a front side illuminated image sensor. In some embodiments, the image sensor device is a back side illuminated image sensor. It is understood that additional processing steps may be performed before, during, or after the method 10 of FIG. 1. But for the sake of simplicity, these additional processing steps are not discussed in detail herein.

FIGS. 2 to 9 are diagrammatic fragmentary sectional side views of various embodiments of an apparatus that is a back side illuminated (BSI) image sensor device 30 at various stages of fabrication according to aspects of the method 10 of FIG. 1. The image sensor device 30 includes an array or grid of pixels for sensing and recording an intensity of radiation (such as light) directed toward a back-side of the image sensor device 30. The image sensor device 30 may include a charge-coupled device (CCD), complimentary metal oxide semiconductor (CMOS) image sensor (CIS), an active-pixel sensor (APS), or a passive-pixel sensor. The image sensor device 30 further includes additional circuitry and input/outputs that are provided adjacent to the grid of pixels for providing an operation environment for the pixels and for supporting external communication with the pixels. It is understood that FIGS. 2 to 9 have been simplified for a better understanding of the inventive concepts of the present disclosure and may not be drawn to scale.

Figure 2:
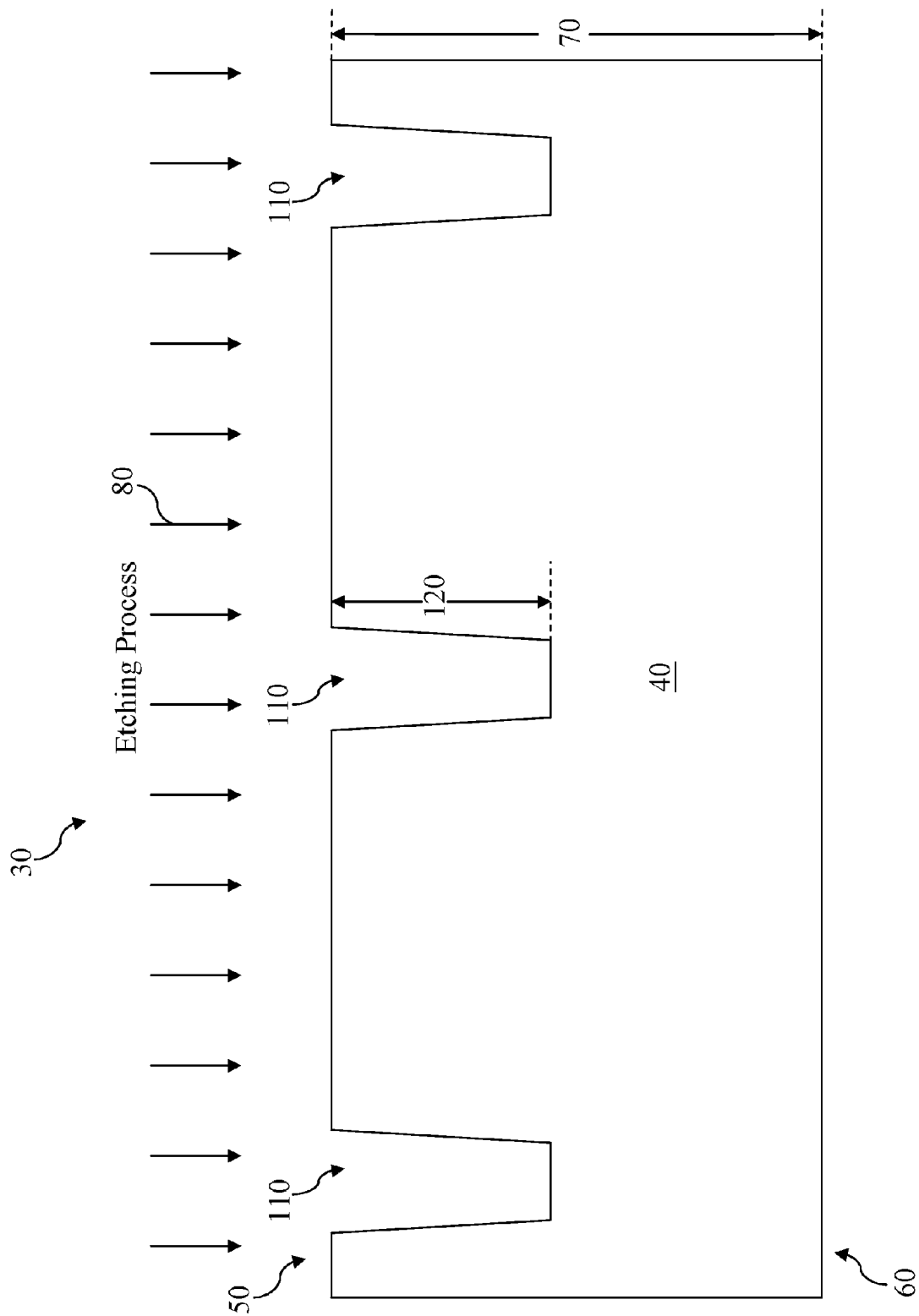
FIGS. 2-9 are diagrammatic fragmentary cross-sectional side views of an image sensor device at various stages of fabrication in accordance with various aspects of the present disclosure.

With reference to FIG. 2, the image sensor device 30 includes a device substrate 40. The device substrate 40 is a silicon substrate doped with a p-type dopant such as Boron (for example a p-type substrate). Alternatively, the device substrate 40 could be another suitable semiconductor material. For example, the device substrate 40 may be a silicon substrate that is doped with an n-type dopant such as phosphorous or arsenic (an n-type substrate). The device substrate 40 could include other elementary semiconductors such as germanium and diamond. The device substrate 40 could optionally include a compound semiconductor and/or an alloy semiconductor. Further, the device substrate 40 could include an epitaxial layer (epi layer), may be strained for performance enhancement, and may include a silicon-on-insulator (SOI) structure.

Referring back to FIG. 2, the device substrate 40 has a front side (also referred to as a front surface) 50 and a back side (also referred to as a back surface) 60. For a BSI image sensor device such as the image sensor device 30, radiation is projected from the back side 60 after thinning down and enters the remaining epi layer through the back surface. The reversed device is supported by a carrier wafer. In some embodiments, the initial thickness 70 is in a range from about 100 microns (um) to about 3000 um, for example between about 500 um and about 1000 um.

A plurality of shallow trench isolation (STI) structures is formed in the substrate 40. In some embodiments, the STI structures are formed by the following process steps: etching openings into the substrate 40 from the front side 50; filling the openings with a dielectric material such as silicon oxide, silicon nitride, silicon oxynitride, a low-k material, or another suitable dielectric material; and thereafter performing a polishing process—for example a chemical mechanical polishing (CMP) process—to planarize the surface of the dielectric material filling the openings. For the sake of simplicity, these STI structures are not illustrated herein.

According to various aspects of the present disclosure, deep trench isolation (DTI) structures are also formed in the device substrate 40. In some embodiments, the DTI structures are formed after the formation of the STI structures. The formation of the DTI structures according to certain embodiments of the present disclosure will now be discussed in more detail.

An etching process 80 is performed to the front side 50 of the substrate 40 to form a plurality of openings (or recesses/trenches). The etching process 80 includes a dry etching process. An etching mask (for example a hard mask, not illustrated herein) may be formed before the etching process 80 is performed to define the size and location of the openings. Three of such openings are illustrated in FIG. 2 as openings 110 for the sake of providing an illustration. The openings 110 are the trenches for the DTI structures, which will be formed later by filling the openings 110. The openings 110 may be formed to have a trapezoidal shape, a somewhat rectangular shape, or another suitable shape. The openings 110 each have a depth 120, which measures the amount of extension into the substrate 40 from the front side 50. The depth 120 is greater than the depth of the STI structures, since the openings 110 are the trenches for deep (as opposed to shallow) trench isolation structures. In an embodiment, the depth 120 of the openings 110 is in a range from about 0.2 um to about 3 um.

Figure 3:
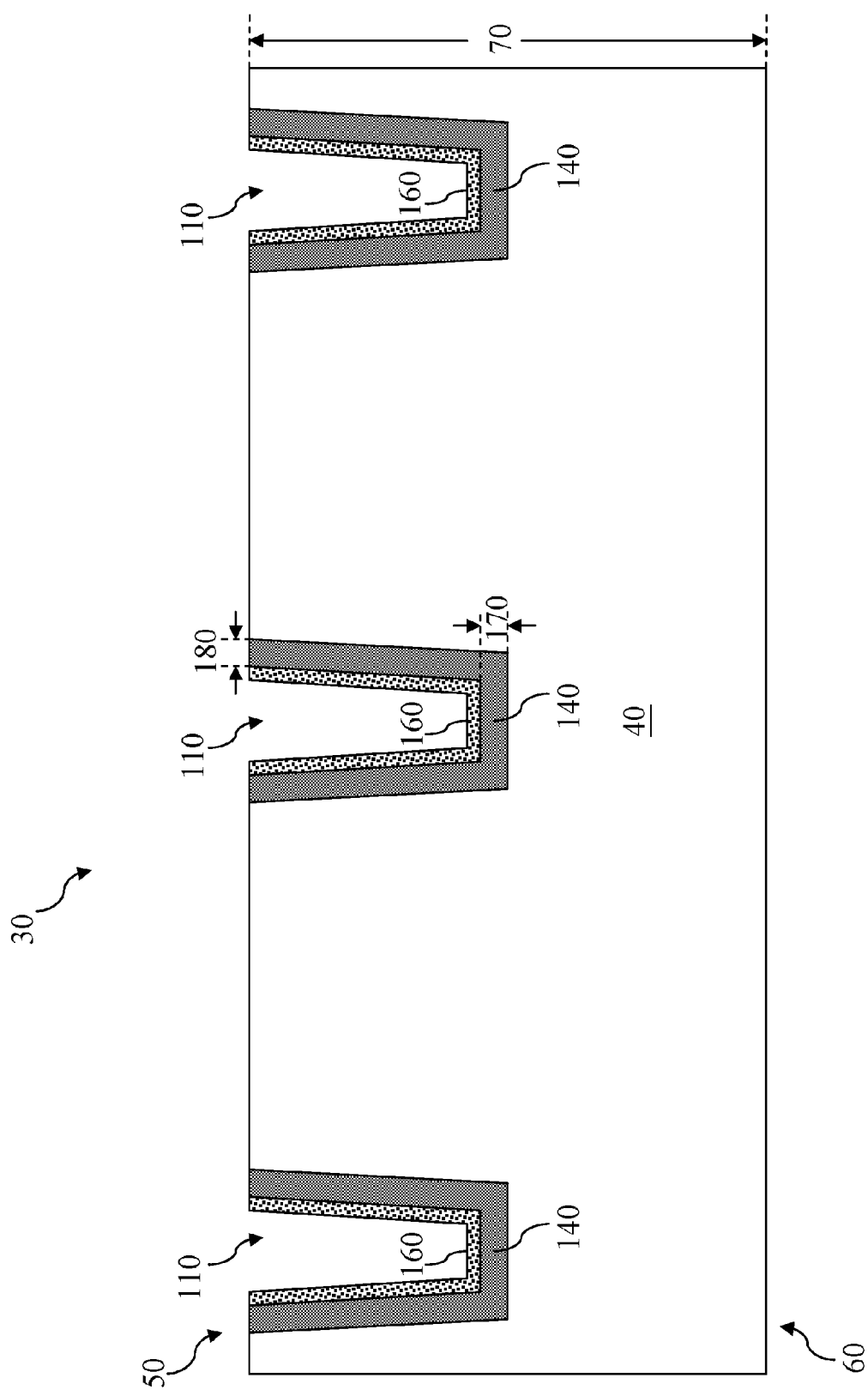

Referring now to FIG. 3, doped regions 140 are formed in a conformal manner around the openings 110 according to one embodiment of the present disclosure. In the embodiment illustrated in FIG. 3, dopant-containing layers 160 are formed on the exposed surfaces (including the sidewalls) of the openings 110. The dopant-containing layers 160 contain a dopant material having the same doping polarity as the substrate 40. In the present embodiment, the dopant material includes a p-type dopant such as Boron. For example, the dopant-containing layer 160 includes Boron-Silicate Glass (BSG) in some embodiments. The BSG material may have a Boron content between about 2% by weight and about 10% by weight. The formation of the BSG material may utilize Tetraethyl Orthosilicate (TEOS) as a precursor. The formation of the BSG material may also involve the use of an Ozone gas (O3). The flow rate of the Ozone gas may be in a range from about 3000 standard cubic centimeters per minute (sccm) to about 7000 sccm in some embodiments. The Ozone gas is used to form a Silicon Oxide then doping Boron by BSG. The formation of the BSG material may also be done in a pressurized and heated environment having a pressure in a range between about 150 Torr to about 600 Torr, and at a temperature in a range from about 300 degrees Celsius to about 500 degrees Celsius.

For the Ozone TEOS BSG doping embodiment, a dopant drive-in process may be performed to facilitate dopant diffusion from the dopant-containing layer 160 into the surrounding regions of the substrate 140 because it's a thermal process without Argon or Helium bombardment. In some embodiments, the dopant drive-in process includes a thermal process, such as a Rapid Annealing Process (RTA). The RTA process may be performed at a process temperature greater than about 1000 degrees Celsius for a process duration of about 5-15 seconds. As a result of the dopant drive-in process, the doped regions 140 are formed in the substrate 40 through the diffusion of the dopant material (e.g., Boron for the illustrated embodiment) from the dopant-containing layer 160 into the surrounding regions of the substrate 40.

The doped regions 140 each have a substantially conformal shape with respect to its corresponding opening 110. In some embodiments, the conformal shape of the doped regions may mean that the profile of each doped region 140 follows or takes on the profile of its corresponding opening 110. In certain cases, the thickness throughout the doped regions 140 does not have substantial variations. For example, a vertical depth 170 of the doped regions 140 is not substantially different from a horizontal width 180 of the doped regions 140. In some embodiments, the thickness variation is less than about 5% doped regions 140. It is understood that the dopant-containing layer 160 is eventually removed after the dopant diffusion process is complete. The dopant-containing layer 160 may be removed by a wet etching process.

The embodiment discussed above with reference to FIG. 3 utilizes a solid material (i.e., the dopant-containing layer 160) to carry out dopant diffusion so as to form the conformal-shaped doped regions 140. Since the dopant diffusion is done using a solid material, the embodiment of FIG. 3 may be referred to as a solid phase doping method. Next, a gas phase doping method embodiment is discussed with reference to FIG. 4.

Figure 4:
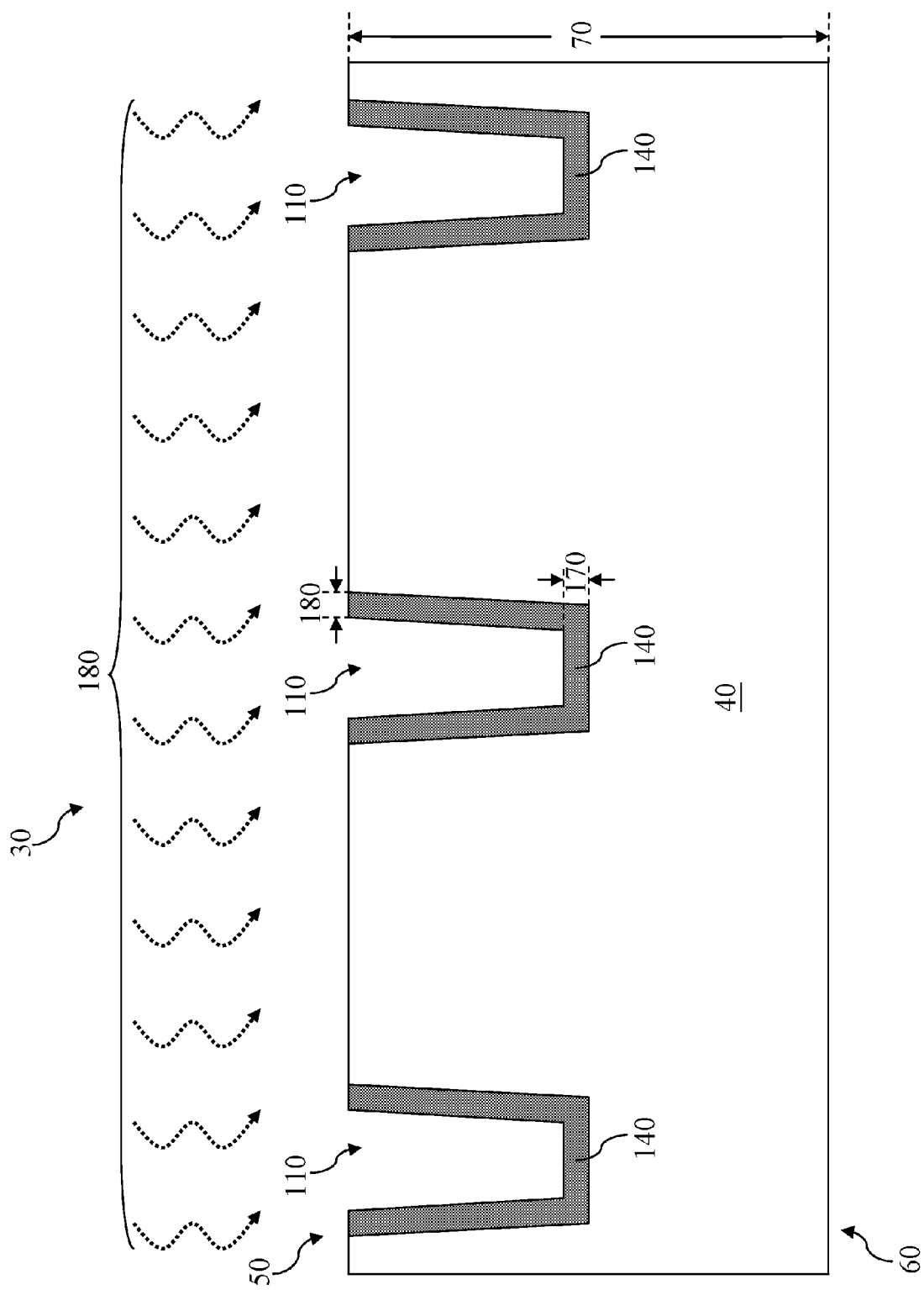

Referring to FIG. 4, no dopant-containing layer is formed in the openings 110. Instead, a plasma pre-treatment process is first performed to pre-treat the surfaces of the openings 110. In some embodiments, the plasma pre-treatment process involves Argon or Helium bombardment. The Argon or Helium may have a flow rate in a range from about 4000 sccm to about 8000 sccm. It is noted that in comparison, the solid phase doping method discussed above in FIG. 3 does not involve an Argon/Helium pre-treatment process.

After the Argon/Helium pre-treatment process, a dopant-containing gas 180 is used to diffuse a dopant into regions of the substrate 40 surrounding the openings 110. Similar to the dopant-containing layer 160, the dopant-containing gas 180 also includes a dopant material having the same doping polarity as that of the substrate 40. Thus, in the illustrated embodiment, the dopant-containing gas contains 180 Boron. In some embodiments, the dopant-containing gas includes Triethylborane (TEB) and has a mass flow rate in a range from about 20 milligrams per minute (mgm) to about 200 mgm. The dopant diffusion from the dopant-containing gas 180 into the regions of the substrate 40 surrounding the openings 110 also causes the doped regions 140 to be formed in a conformal manner around the openings 110. Since the dopant diffusion is carried out using a gas material rather than a solid material, the embodiment discussed above with reference to FIG. 4 may be referred to as a gas phase doping method.

Figure 5:
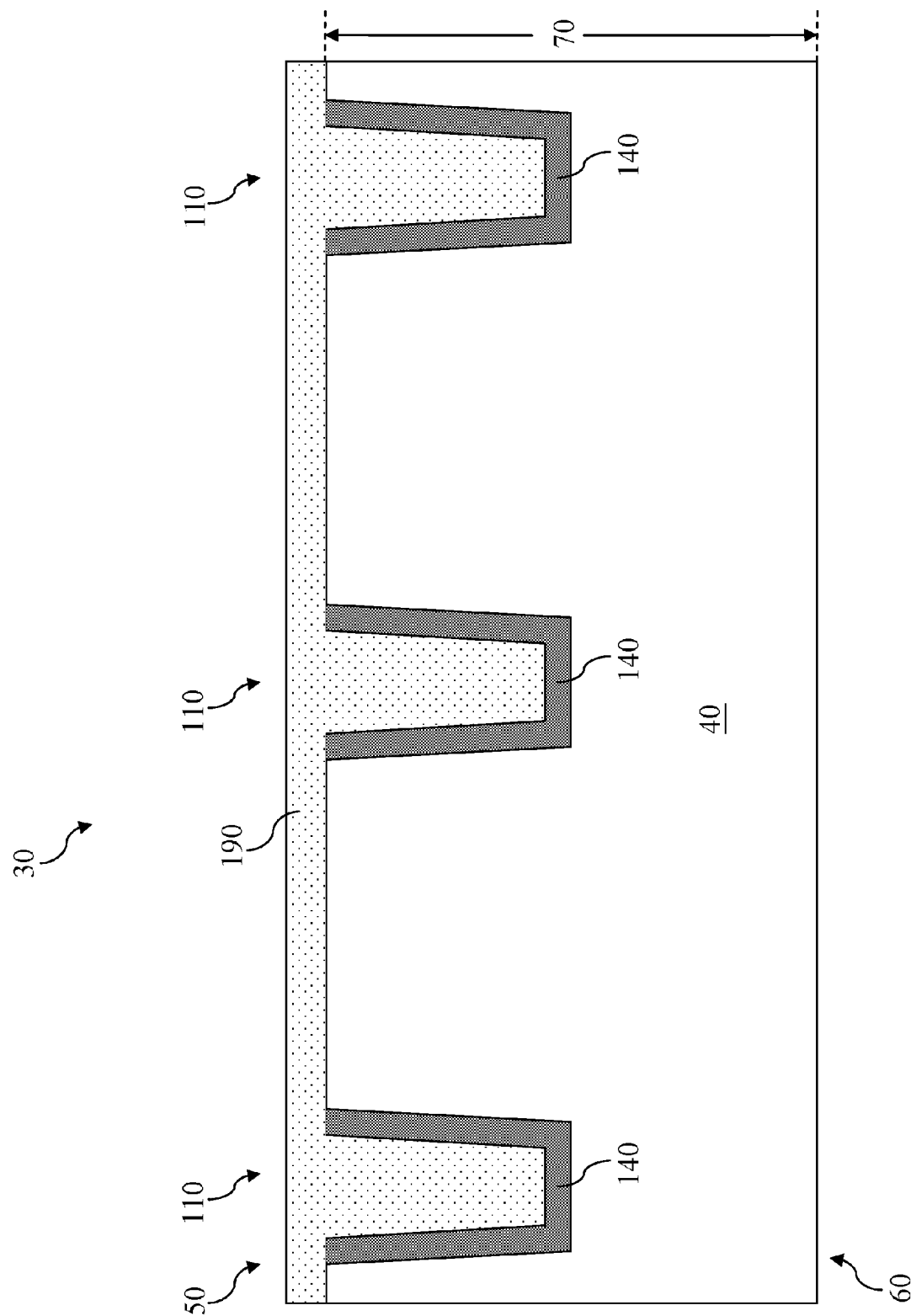

Referring now to FIG. 5, after the doped regions 140 are formed using either the solid phase doping method of FIG. 3 or the gas phase doping method of FIG. 4, a dielectric material 190 is formed on the substrate 40 from the front side 50. The dielectric material 190 fills the openings 110. In some embodiments, the dielectric material includes silicon oxide, silicon nitride, silicon oxynitride, a low-k dielectric, or another suitable dielectric material.

Figure 6:
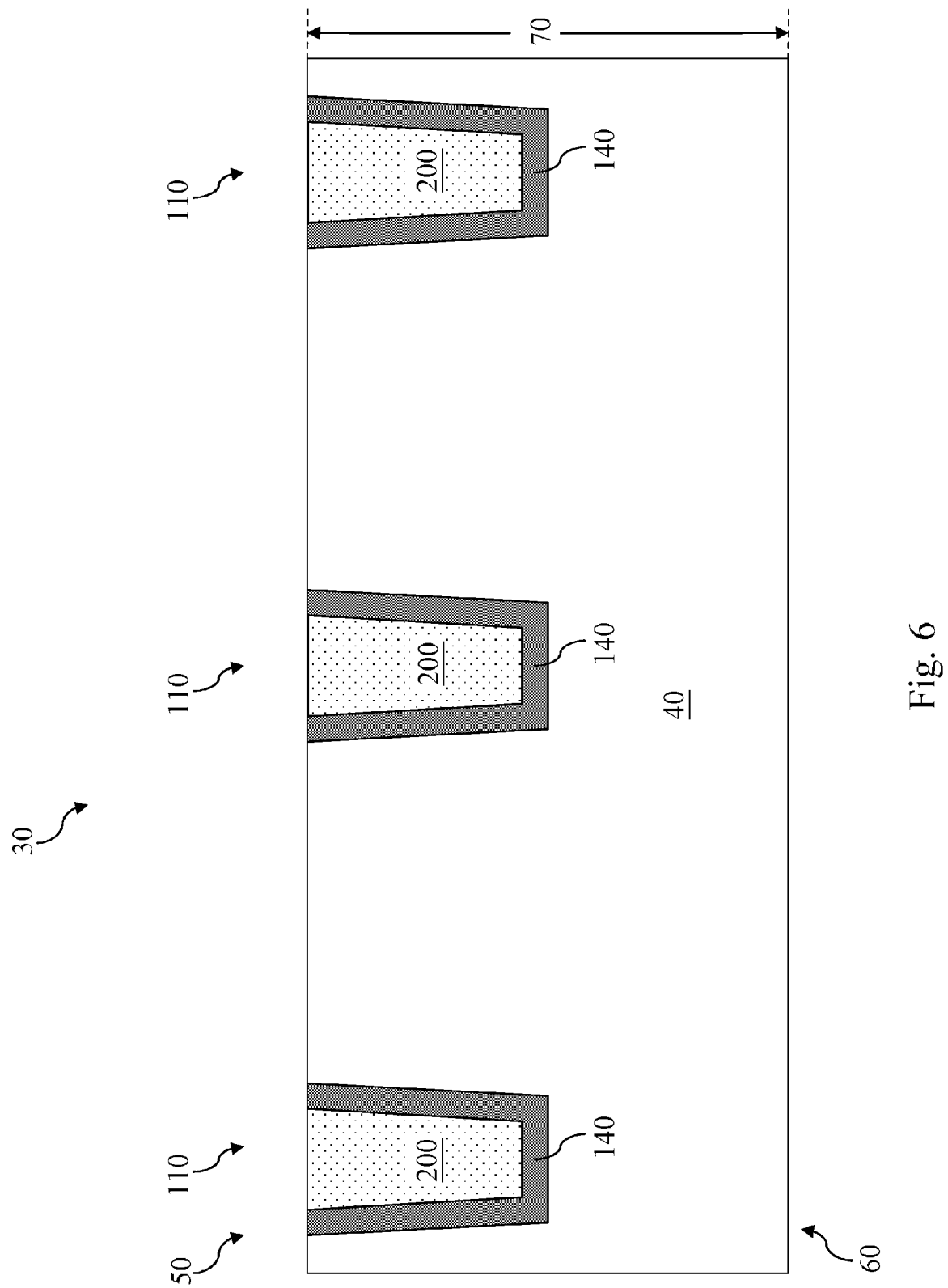

Referring now to FIG. 6, the portions of the dielectric material 190 outside the openings 110 are removed, for example through a suitable etch back process if using a conformal gap filling process for DTI, such as Furnace HDP. Or a CMP process for traditional gap filling planarization may be performed instead. DTI structures 200 are thus formed by the remaining portions of the dielectric material filling the openings 110. As shown in FIG. 6, each of the DTI structures 200 is conformally surrounded by a respective one of the doped regions 140.

Figure 7:
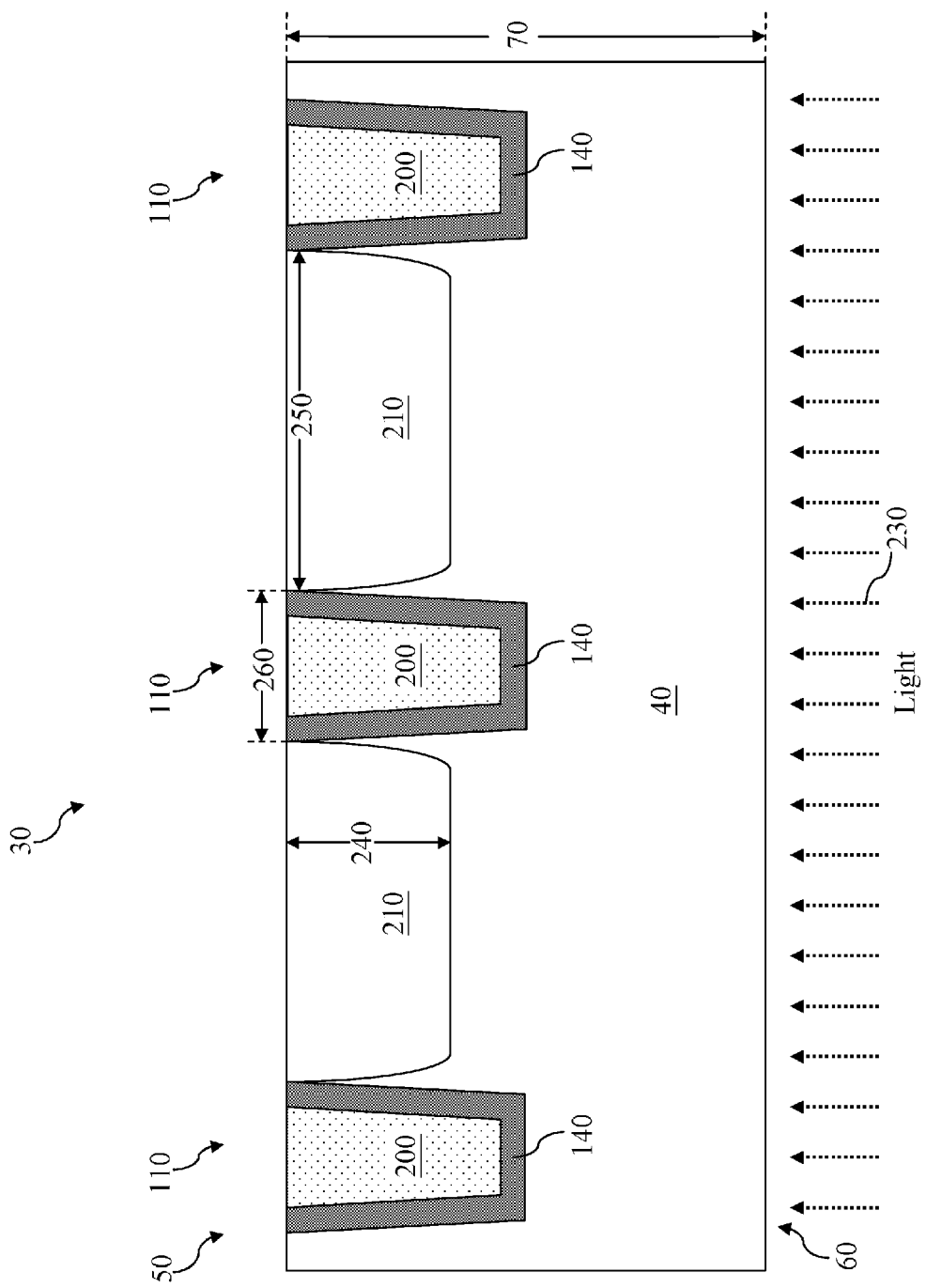

Referring now to FIG. 7, a plurality of pixels is formed in the substrate 40. Two of such pixels are illustrated in FIG. 7 as pixels 210. The pixels 210 contain radiation-sensing doped regions. These radiation-sensing doped regions are formed by one or more ion implantation processes or diffusion processes and are doped with a doping polarity opposite from that of the substrate 40 (or the doped region 140). Thus, in the embodiment illustrated, the pixels 210 contain n-type doped regions. For a BSI image sensor device such as the image sensor device 30, the pixels 210 are operable to detect radiation, such as an incident light 230, that is projected toward device substrate 40 from the back side 60. In some embodiments, the pixels 210 each include a photodiode. A deep implant region may be formed below each photodiode in some embodiments. In other embodiments, the pixels 210 may include pinned layer photodiodes, photogates, reset transistors, source follower transistors, and transfer transistors. The pixels 210 may also be referred to as radiation-detection devices or light-sensors.

The pixels 210 may be varied from one another to have different junction depths, thicknesses, widths, and so forth. In some embodiments, the pixels 210 have a depth 240 (vertical dimension) ranging from about 1 um to about 4 um, and a width 250 (horizontal dimension) ranging from about 0.5 um to about 2 um. The depth 240 of the pixels 210, however, is less than the combined depth of each DTI structure 200 and its surrounding doped region 140. In some embodiments, the depth 120 (shown in FIG. 2) of the DTI structure 200 alone exceeds the depth 240 of the pixels 210. The adjacent pixels 210 are also separated by a distance 260. In some embodiments, the distance is in a range from about 0.05 um to about 0.2 um.

The conformal doped regions 140 formed around the DTI structures 200 according to the embodiments discussed above offer advantages over conventional image sensor devices, for example advantages in dark current and cross-talk performances. However, it is understood that not all advantages are necessarily discussed herein, and other embodiments may offer different advantages, and that no particular advantage is required for all embodiments.

Two common image sensor defects are dark current and cross-talk. Dark current may be defined as the existence of pixel current when no actual illumination is present. In other words, the pixel "detects" light when it is not supposed to. Cross-talk refers to electrical interference from neighboring pixels that degrades the light-sensing reliability and accuracy of the pixels. Both dark current and cross-talk defects may be caused or at least contributed to by various aspects of conventional image sensor fabrication. For example, the formation of a dielectric trench typically is done using dry etching. The dry etching process may cause defects to be formed on the surface of the trench, especially in the sidewalls and corner regions of the trench. These surface defects may result in the movement of free charge carriers (for example electrons). When these free charge carriers are sensed by a pixel, the dark current defect may occur. Some conventional image sensors rely on dielectric trenches to prevent charge carriers from drifting into neighboring pixels. However, dielectric trenches alone are often times not effective enough as barriers for the charge carriers, particularly when the dielectric trenches are shallow. Consequently, cross-talk defects may occur when charge carriers move around the dielectric trenches and are thereafter detected by neighboring pixels.

Some image sensor devices attempt to remedy these problems discussed above by forming doped isolation regions between neighboring pixels. For example, deep well isolation devices may be formed by ion implantation processes. However, these solutions suffer from many drawbacks as well. For example, the formation of a doped isolation device may require multiple implantation steps, thereby increasing process complexity and fabrication costs.

As another example, to achieve sufficient barrier depth, the formation of the doped isolation regions may require high implantation energies. Such high implantation energies can cause implant damages in the image sensor device, which can then lead to dark current defects. Also, since these doped isolation regions are formed by implantation, which is typically unidirectional, the doped isolation regions are not formed in a conformal manner around the dielectric trenches. Instead, the doped isolation regions are often times implanted below the dielectric trenches, or they may surround the dielectric trenches with uneven thicknesses and/or un-uniform doping concentration levels. The absence of a conformal-shaped doped isolation region around the dielectric trenches may render the doped isolation region ineffective as a barrier for charge carriers. Therefore, defects such as dark current and cross-talk may still be present.

Another problem of the implantation method of forming doped isolation regions is related to implantation masks required to carry out the implantation process. In one aspect, the height (or vertical dimension) of the masks need to remain sufficiently great in order to withstand the high implantation energies. For example, to form effective doped isolation regions having sufficient depths to block carrier drift, the implantation energies may reach 1 mega-electron-volt (MeV) or more. Such high implantation energies may require implantation masks that are a few microns thick. Thick implantation masks (e.g., a hard mask having a thickness greater than about 2 um) may be difficult to remove subsequently, thereby increasing fabrication process difficulties and the likelihood of causing damages to the image sensor.

In another aspect, as image pixel sizes and the spacing between adjacent pixels continue to shrink, the width (or horizontal dimension) of the implantation masks are shrunk as well. The ever-decreasing widths of the implantation masks may entail lithography process difficulties, as these small widths may be beyond the capabilities of many existing lithography processes and equipment. Thus, advanced (and costly) lithography tools may be needed to accurately perform the implantation processes, thereby driving up fabrication costs and difficulties even further.

In comparison, the doped isolation region 140 herein is formed not by using direct ion implantation, but through diffusion of dopants. The tools for the dopant diffusion process are compatible with (or can be handled by) existing processing equipment. Thus, no expensive lithography tools are required to perform precise and/or lengthy implantation processes. Nor do the embodiments disclosed herein require the difficult removal of thick implantation masks (since no implantation masks are used). Moreover, the dopant diffusion processes discussed herein result in conformal doped isolation regions that surround the dielectric trenches, thereby improving dark current and cross-talk performance over unconformal doped isolation regions for reasons discussed above.

Figure 8:
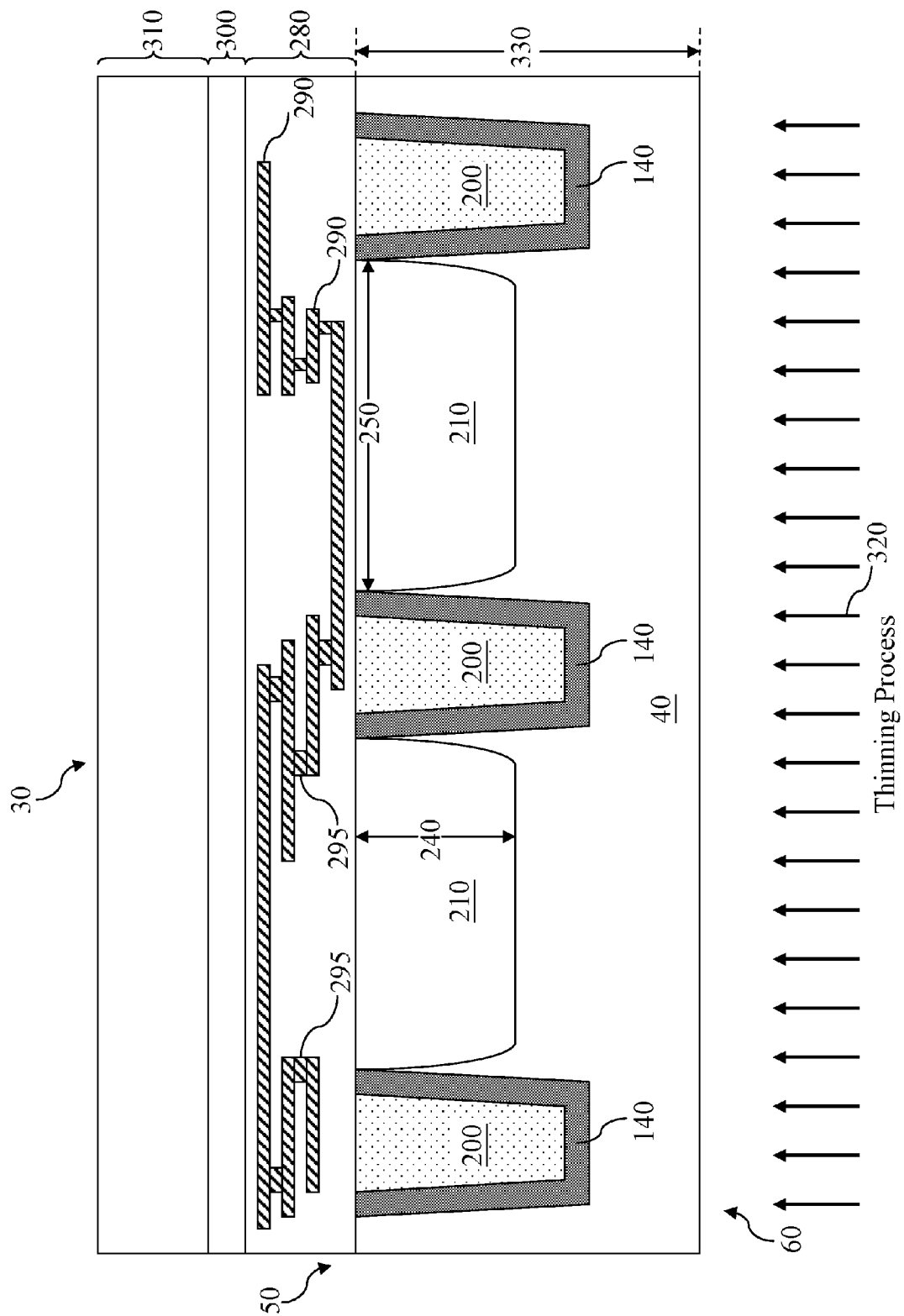

Additional fabrication processes may be performed to complete the fabrication of the BSI image sensor device 30, as discussed below. Referring to FIG. 8, an interconnect structure 280 is formed over the front side 50 of the device substrate 40. The interconnect structure 280 includes a plurality of patterned dielectric layers and conductive layers that provide interconnections (e.g., wiring) between the various doped features, circuitry, and input/output of the image sensor device 30. The interconnect structure 280 includes an interlayer dielectric (ILD) and a multilayer interconnect (MLI) structure. The MLI structure includes contacts, vias and metal lines. For purposes of illustration, a plurality of conductive lines 290 and vias/contacts 295 are shown in FIG. 8, it being understood that the conductive lines 290 and vias/contacts 295 illustrated are merely exemplary, and the actual positioning and configuration of the conductive lines 290 and vias/contacts 295 may vary depending on design needs and manufacturing concerns.

The MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD) (or sputtering), chemical vapor deposition (CVD), atomic layer deposition (ALD), or combinations thereof. Other manufacturing techniques to form the aluminum interconnect may include photolithography processing and etching to pattern the conductive materials for vertical connection (for example, vias/contacts 295) and horizontal connection (for example, conductive lines 290). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect structure may be formed by a technique including CVD, sputtering, plating, or other suitable processes.

Still referring to FIG. 8, a buffer layer 300 is formed on the interconnect structure 280. In the present embodiment, the buffer layer 300 includes a dielectric material such as silicon oxide. Alternatively, the buffer layer 300 may optionally include silicon nitride. The buffer layer 300 is formed by CVD, PVD, or other suitable techniques. The buffer layer 300 is planarized to form a smooth surface by a CMP process.

Thereafter, a carrier substrate 310 is bonded with the device substrate 40 through the buffer layer 300, so that processing of the back side 60 of the device substrate 40 can be performed. The carrier substrate 310 in the present embodiment is similar to the substrate 40 and includes a silicon material. Alternatively, the carrier substrate 310 may include a glass substrate or another suitable material. The carrier substrate 310 may be bonded to the device substrate 40 by molecular forces—a technique known as direct bonding or optical fusion bonding—or by other bonding techniques known in the art, such as metal diffusion or anodic bonding.

Referring back to FIG. 8, the buffer layer 300 provides electrical isolation between the device substrate 40 and the carrier substrate 310. The carrier substrate 310 provides protection for the various features formed on the front side 50 of the device substrate 40, such as the pixels 210. The carrier substrate 310 also provides mechanical strength and support for processing of the back side 60 of the device substrate 40 as discussed below. After bonding, the device substrate 40 and the carrier substrate 310 may optionally be annealed to enhance bonding strength.

Still referring to FIG. 8, after the carrier substrate 310 is bonded, a thinning process 320 is then performed to thin the device substrate 40 from the backside 60. The thinning process 320 may include a mechanical grinding process and a chemical thinning process. A substantial amount of substrate material may be first removed from the device substrate 40 during the mechanical grinding process. Afterwards, the chemical thinning process may apply an etching chemical to the back side 60 of the device substrate 40 to further thin the device substrate 40 to a thickness 330, which is on the order of a few microns. In some embodiments, the thickness 330 is greater than about 1 um but less than about 5 um. It is also understood that the particular thicknesses disclosed in the present disclosure are mere examples and that other thicknesses may be implemented depending on the type of application and design requirements of the image sensor device 30.

Figure 9:
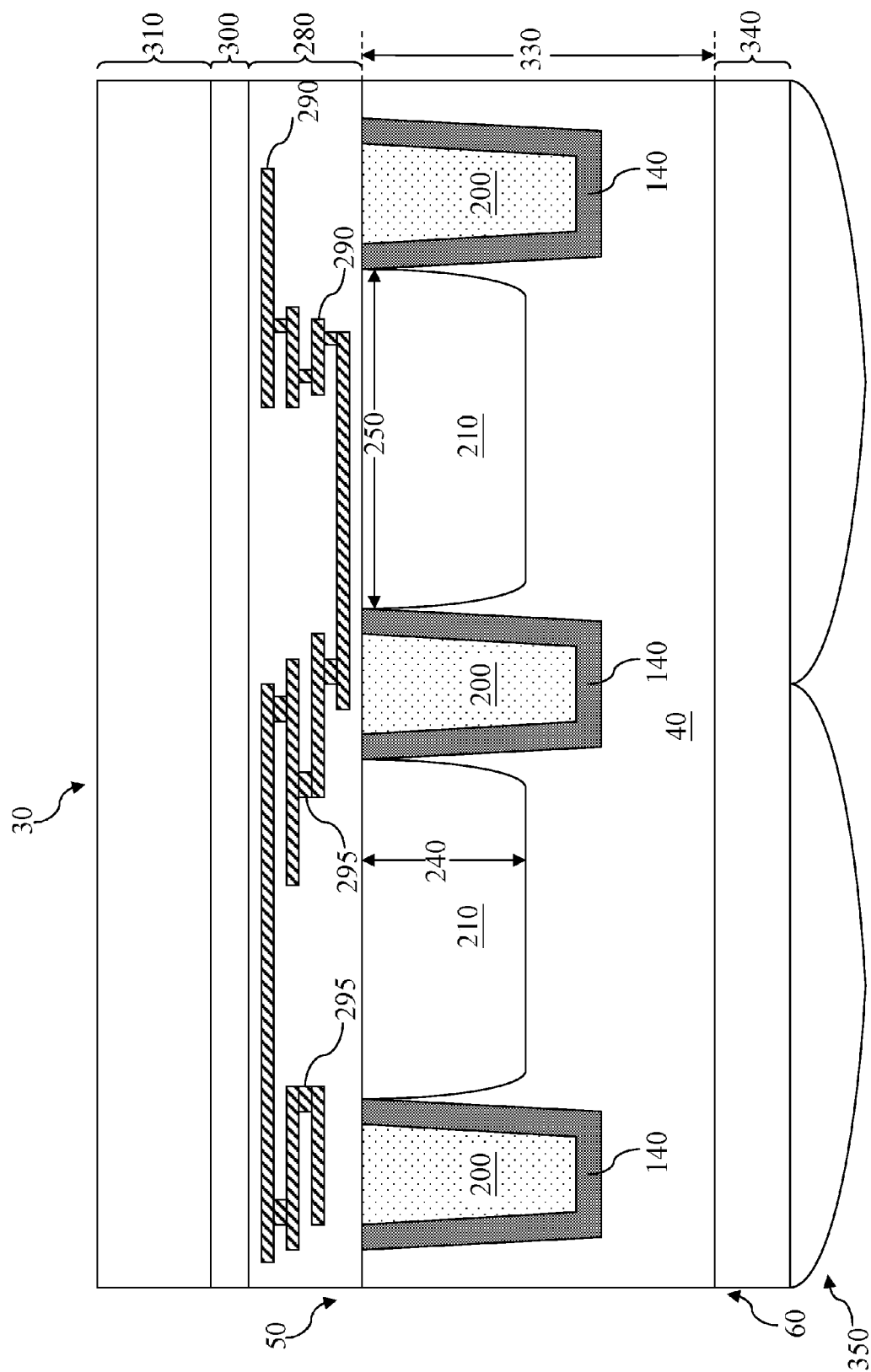

Referring to FIG. 9, a color filter layer 340 may be formed on the back side 60 of the substrate 40. The color filter layer 340 may contain a plurality of color filters that may be positioned such that the incoming radiation is directed thereon and therethrough. The color filters may include a dye-based (or pigment based) polymer or resin for filtering a specific wavelength band of the incoming radiation, which corresponds to a color spectrum (e.g., red, green, and blue). Thereafter, a micro-lens layer 350 containing a plurality of micro-lenses is formed over the color filter layer 340. The micro-lenses direct and focus the incoming radiation toward specific radiation-sensing regions in the device substrate 40, such as pixels 210. The micro-lenses may be positioned in various arrangements and have various shapes depending on a refractive index of a material used for the micro-lens and distance from a sensor surface. The device substrate 40 may also undergo an optional laser annealing process before the forming of the color filter layer 340 or the micro-lens layer 350.

It is understood that the sequence of the fabrication processes described above is not intended to be limiting. Some of the layers or devices may be formed according to different processing sequences in other embodiments than what is shown herein. Furthermore, some other layers may be formed but are not illustrated herein for the sake of simplicity. For example, an anti-reflection coating (ARC) layer may be formed over the back side 60 of the substrate 40 before the formation of the color filter layer 340 and/or the micro-lens layer 350.

It is also understood that the discussions above pertain mostly to a pixel region of the image sensor device 30. In addition to the pixel region, the image sensor 30 also includes a periphery region, a bonding pad region, and a scribe line region. The periphery region may include devices that need to be kept optically dark. These devices may include digital devices, such as application-specific integrated circuit (ASIC) devices or system-on-chip (SOC) devices, or reference pixels used to establish a baseline of an intensity of light for the image sensor device 30. The bonding pad region is reserved for the formation of bonding pads, so that electrical connections between the image sensor device 30 and external devices may be established. The scribe line region includes a region that separates one semiconductor die from an adjacent semiconductor die. The scribe line region is cut therethrough in a later fabrication process to separate adjacent dies before the dies are packaged and sold as integrated circuit chips. For the sake of simplicity, the details of these other regions of the image sensor device 30 are not illustrated or described herein.

The above discussions also pertain to a BSI image sensor device. However, it is contemplated that the various aspects of the present disclosure may be applied to a front side illuminated (FSI) image sensor device as well. For example, the FSI image sensor device also uses pixels similar to the pixels 210 discussed herein to detect light, though the light is projected (and enters the substrate) from the front side, rather than the back side. The FSI image sensor does not involve wafer back side thinning processes, and will instead form the color filters and micro-lenses on the front side. The interconnect structure is implemented in a manner so as to not impede or obstruct the path of incident light projected from the front side. It can be seen that the doped isolation regions may also be formed conformal to the dielectric trenches between neighboring pixels using the solid phase or the gas phase dopant diffusion methods discussed herein. As is the case for the BSI image sensor device, the conformal doped isolation regions may also enhance the dark current and cross-talk performance of the FSI image sensor device. For the sake of simplicity, the processing details of the FSI image sensor device are not discussed herein.

One of the broader forms of the present disclosure involves an image sensor device that includes: a substrate; a first pixel and a second pixel disposed in the substrate, the first and second pixels being neighboring pixels; an isolation structure disposed in the substrate and between the first and second pixels; and a doped isolation device disposed in the substrate and between the first and second pixels, wherein the doped isolation device surrounds the isolation structure in a conformal manner.

In some embodiments, the first and second pixels each include a doped radiation-sensing region.

In some embodiments, the doped isolation device and the doped radiation-sensing region have different doping polarities.

In some embodiments, a depth of the first and second pixels is less than a depth of the isolation structure.

In some embodiments, the isolation structure contains a dielectric material.

In some embodiments, the isolation structure includes a deep trench isolation (DTI) device.

In some embodiments, the semiconductor image sensor device is a back side illuminated (BSI) image sensor device.

In some embodiments, the semiconductor image sensor device is a front side illuminated (FSI) image sensor device.

Another one of the broader forms of the present disclosure involves an image sensor device that includes: a substrate; a plurality of radiation-sensitive regions formed in the substrate, the radiation-sensitive regions having a first doping polarity; a plurality of deep trench isolation (DTI) devices formed in the substrate, wherein each pair of neighboring radiation-sensitive regions is separated from one another by a respective one of the DTI devices; and a plurality of doped regions formed in the substrate and having a second doping polarity that is opposite the first doping polarity, wherein each DTI device is surrounded in a conformal manner by a respective one of the doped regions.

In some embodiments, the radiation-sensitive regions each include a photodiode having Arsenic or Phosphorous as a dopant, and wherein the doped regions have Boron as a dopant.

In some embodiments, the DTI devices extend further into the substrate than the radiation-sensitive regions.

In some embodiments, the semiconductor image sensor device further includes: an interconnect structure formed on a front side of the substrate; and a color filter layer and a micro-lens layer formed on a back side of the substrate opposite the front side.

In some embodiments, the semiconductor image sensor device further includes: an interconnect structure formed on a front side of the substrate; and a color filter layer and a micro-lens layer formed over the front side of the substrate, the color filter layer and the micro-lens layer being formed over the interconnect structure on the front side.

Still another of the broader forms of the present disclosure involves a method of fabricating an image sensor device, the method includes: forming an opening in a semiconductor substrate; forming a doped region in the substrate using one of: a solid phase doping process and a gas phase doping process, wherein the doped region is formed to surround the opening in a conformal manner; filling the opening with a dielectric material; and forming a first radiation-sensing region and a second radiation-sensing region in the substrate, wherein the first and second radiation-sensing regions are formed on opposite sides of the opening.

In some embodiments, the solid phase doping process and the gas phase doping process are each carried out using a dopant diffusion process.

In some embodiments, the solid phase doping process is performed using a Boron-Silicate Glass (BSG) material and a thermal treatment process; and the gas phase doping process is performed using a Triethylborane (TEB) gas.

In some embodiments, the forming the doped region is performed free of ion implantation.

In some embodiments, the forming the opening and the filling the opening are carried out in a manner such that a deep trench isolation (DTI) device is formed by the dielectric material filling the opening.

In some embodiments, the first and second radiation-sensing regions each have a first doping polarity; and the doped region has a second doping polarity different from the first doping polarity.

In some embodiments, the substrate has a front side and a back side opposite the front side, and the method further includes: forming an interconnect structure on the front side of the substrate; bonding the substrate to a carrier substrate, the interconnect structure being bonded between the substrate and the carrier substrate; thereafter thinning the substrate from the back side; forming a color filter layer on the back side of the thinned substrate; and forming a micro-lens layer over the color filter layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor image sensor device, comprising:
   forming a first opening and a second opening in a semiconductor substrate;
   forming a first doped region and a second doped region in the substrate using one of: a solid phase doping process and a gas phase doping process, wherein the first doped region is formed to surround the first opening in a conformal manner and wherein the second doped region is formed to surround the second opening in a conformal manner;
   filling the first opening with a dielectric material; and
   forming a first radiation-sensing region and a second radiation-sensing region in the substrate, wherein the first and second radiation-sensing regions are formed on opposite sides of either the first opening or the second opening, wherein the first radiation-sensing region includes a third doped region extending continuously within the semiconductor substrate from the first doped region to the second doped region, wherein the first doped region includes an edge that faces an edge of the third doped region in the semiconductor substrate, wherein a first portion of the edge of the first doped region physically contacts a first portion of the edge of the third doped region and wherein a second portion of the edge of the first doped region is separated from a second portion of the edge of the third doped region by a portion of the semiconductor substrate.

2. The method of claim 1, wherein the solid phase doping process and the gas phase doping process are each carried out using a dopant diffusion process.

3. The method of claim 1, wherein:
   the solid phase doping process is performed using a Boron-Silicate Glass (BSG) material and a thermal treatment process; and
   the gas phase doping process is performed using a Triethylborane (TEB) gas.

4. The method of claim 1, wherein the forming the first doped region is performed free of ion implantation.

5. The method of claim 1, wherein the forming the first opening and the filling the first opening are carried out in a manner such that a deep trench isolation (DTI) device is formed by the dielectric material filling the first opening.

6. The method of claim 1, wherein:
   the first and second radiation-sensing regions each have a first doping polarity; and
   the first doped region has a second doping polarity different from the first doping polarity.

7. The method of claim 1, wherein the substrate has a front side and a back side opposite the front side, and further comprising:
   forming an interconnect structure on the front side of the substrate;
   bonding the substrate to a carrier substrate, the interconnect structure being bonded between the substrate and the carrier substrate;
   thereafter thinning the substrate from the back side;
   forming a color filter layer on the back side of the thinned substrate; and
   forming a micro-lens layer over the color filter layer.

8. A method comprising:
   forming a first opening and a second opening in a semiconductor substrate;
   forming a first doped region that surrounds the first opening in a conformal manner and a second doped region that surrounds the second opening in a conformal manner;
   forming a dielectric material in the first and second openings; and
   forming a radiation-sensing region in the semiconductor substrate such that the radiation-sensing region includes a third doped region extending continuously within the semiconductor substrate from the first doped region to the second doped region, wherein the first doped region includes an edge that faces an edge of the third doped region in the semiconductor substrate, wherein a first portion of the edge of the first doped region physically contacts a first portion of the edge of the third doped region and wherein a second portion of the edge of the first doped region is separated from a second portion of the edge of the third doped region by a portion of the semiconductor substrate.

9. The method of claim 8, wherein forming the first doped region that surrounds the first opening in the conformal manner includes forming a dopant material layer within the first opening and performing a diffusion process to diffuse a portion of the dopant material layer into the semiconductor substrate adjacent the first opening.

10. The method of claim 8, wherein forming the first doped region that surrounds the first opening in the conformal manner includes performing a plasma treatment process to the semiconductor substrate exposed within the first opening and applying a dopant containing gas to the treated exposed semiconductor substrate such that the dopant diffuses into the semiconductor substrate adjacent the first opening.

11. The method of claim 10, wherein performing the plasma treatment process includes performing the plasma treatment process with at least one material selected from the group consisting of Argon and Helium.

12. The method of claim 8, further comprising forming a color filter layer over a first side of the semiconductor substrate, and
   wherein forming the first opening and the second opening in the semiconductor substrate includes forming the first opening and the second opening in a second side of the semiconductor substrate that is opposite the first side.

13. The method of claim 8, wherein the first doped region has the same doping polarity as the semiconductor substrate.

14. The method of 8, further comprising reducing a thickness of the semiconductor substrate after forming a radiation-sensing region in the semiconductor substrate.

15. A method comprising:
   forming a first trench and a second trench in a semiconductor substrate;
   forming a first doped region that surrounds the first trench in a conformal manner and a second doped region that surrounds the second trench in a conformal manner;
   forming a first deep trench isolation structure in the first trench and a second deep trench isolation structure in the second trench; and
   forming a doped radiation-sensing feature in the semiconductor substrate that extends continuously within the semiconductor substrate from the first doped region to the second doped region, wherein the first doped region includes an edge that faces an edge of the doped radiation-sensing feature in the semiconductor substrate, wherein a first portion of the edge of the first doped region physically contacts a first portion of the edge of the doped radiation-sensing feature and wherein a second portion of the edge of the first dope region is separated from a second portion of the edge of the doped radiation-sensing feature by a portion of the semiconductor substrate.

16. The method of claim 15, wherein forming the first deep trench isolation structure in the first trench includes filling the first trench with a dielectric material and planarizing a top surface of the dielectric material.

17. The method of claim 15, further comprising forming an interconnect structure over a first side of the semiconductor substrate; and forming a lens over a second side of the semiconductor substrate that is opposite the first side.

18. The method of claim 15, wherein forming the first doped region that surrounds the first trench in the conformal manner includes forming a dopant material layer in the first trench and performing a diffusion process such that a portion of the dopant material is diffused into the semiconductor substrate adjacent the first trench.

19. The method of claim 15, wherein forming the first doped region that surrounds the first trench in the conformal manner includes performing a plasma treatment process to the semiconductor substrate exposed within the first trench and applying a dopant containing gas to the treated exposed semiconductor.

20. The method of claim 15, wherein forming the doped radiation-sensing feature in the semiconductor substrate that extends continuously within the semiconductor substrate from the first doped region to the second doped region occurs alter forming the first deep trench isolation structure in the first trench and the second deep trench isolation structure in the second trench.

* * * * *